(12) United States Patent
Aulisio

(10) Patent No.: US 12,027,320 B2
(45) Date of Patent: Jul. 2, 2024

(54) CIRCUIT HAVING A PRINTED CIRCUIT BOARD AND VEHICLE HAVING AT LEAST ONE SUCH CIRCUIT

(71) Applicant: HANON SYSTEMS EFP DEUTSCHLAND GMBH, Bad Homburg v.d. Höhe (DE)

(72) Inventor: Luigi Aulisio, Campiglione Fenile (IT)

(73) Assignee: HANON SYSTEMS EFP DEUTSCHLAND GMBH, Bad Homburg V.D. Höhe (DE)

( * ) Notice: Subject to any disclaimer, the term of this patent is extended or adjusted under 35 U.S.C. 154(b) by 0 days.

(21) Appl. No.: 17/645,863

(22) Filed: Dec. 23, 2021

(65) Prior Publication Data

US 2022/0310325 A1    Sep. 29, 2022

(30) Foreign Application Priority Data

Mar. 23, 2021  (DE) .......................... 102021202801.2

(51) Int. Cl.
| | |
|---|---|
| *H01G 4/30* | (2006.01) |
| *H01G 2/06* | (2006.01) |
| *H01G 4/12* | (2006.01) |
| *H01G 4/232* | (2006.01) |
| *H01G 4/38* | (2006.01) |

(52) U.S. Cl.
CPC ................ *H01G 4/30* (2013.01); *H01G 2/06* (2013.01); *H01G 4/12* (2013.01); *H01G 4/232* (2013.01); *H01G 4/38* (2013.01)

(58) Field of Classification Search
CPC ............ H01G 4/30; H01G 4/12; H01G 4/232; H01G 4/38; H01G 2/02; H01G 2/06

USPC ............ 361/301.4, 321.1, 321.3, 306.3, 328, 361/321.2
See application file for complete search history.

(56) References Cited

U.S. PATENT DOCUMENTS

| | | |
|---|---|---|
| 2011/0304016 A1 | 12/2011 | Nakamura et al. |
| 2012/0020040 A1* | 1/2012 | Lin ........................ H01L 25/105 361/772 |
| 2013/0094122 A1* | 4/2013 | Domes ................. H05K 7/1432 361/321.1 |
| 2015/0029674 A1 | 1/2015 | Ko et al. |
| 2016/0007466 A1* | 1/2016 | Isono ...................... H05K 1/115 361/774 |
| 2016/0120027 A1 | 4/2016 | Park et al. |

FOREIGN PATENT DOCUMENTS

| | | |
|---|---|---|
| DE | 102005026404 A1 | 1/2006 |
| DE | 102004038184 A1 | 3/2006 |
| DE | 102017109321 A1 | 11/2018 |
| JP | H05211378 A | 8/1993 |
| JP | H08316591 A | 11/1996 |

(Continued)

*Primary Examiner* — Arun Ramaswamy
(74) *Attorney, Agent, or Firm* — Shumaker, Loop & Kendrick, LLP; James D. Miller

(57) ABSTRACT

A circuit having a printed circuit board and at least one multilayer ceramic capacitor (MLCC) is described, characterized in that the printed circuit board has at least one opening in the region of the projection of the MLCC on the printed circuit board. The opening is not filled with any material and in the event of the MLCC malfunctioning it essentially prevents heat from accumulating between the MLCC and the printed circuit board.

13 Claims, 5 Drawing Sheets

(56) References Cited

FOREIGN PATENT DOCUMENTS

| | | | |
|---|---|---|---|
| JP | 2636332 | B2 * | 7/1997 |
| JP | 2001044644 | A | 2/2001 |
| JP | 2007273648 | A | 10/2007 |
| JP | 2017117964 | A | 6/2017 |
| JP | 2017162846 | A | 9/2017 |
| KR | 20160047876 | A | 5/2016 |

* cited by examiner

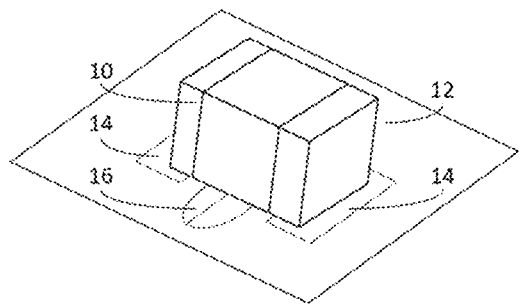
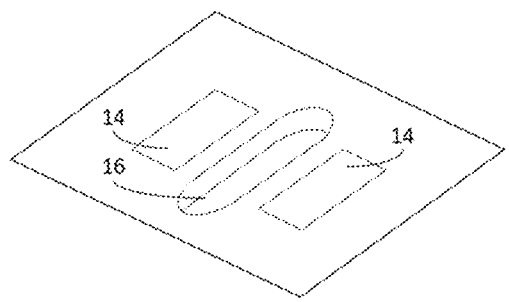
Fig. 1    Fig. 2
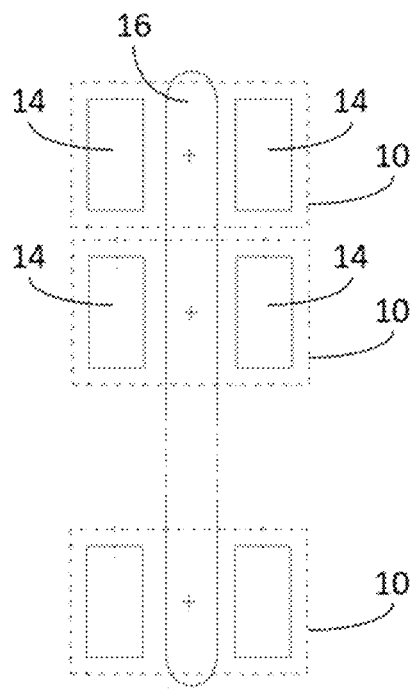
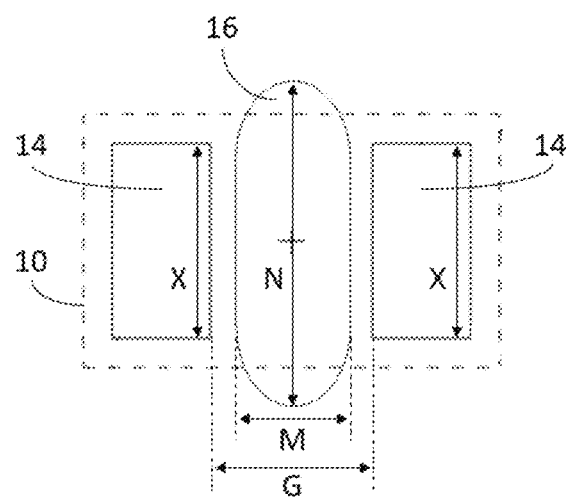
Fig. 3    Fig. 4

CIRCUIT HAVING A PRINTED CIRCUIT BOARD AND VEHICLE HAVING AT LEAST ONE SUCH CIRCUIT

CROSS-REFERENCE TO RELATED PATENT APPLICATIONS

This patent application is claims priority to German Patent Application No. DE 10 2021 202 801.2 filed on Mar. 23, 2021, the entire disclosure of which is hereby incorporated herein by reference.

TECHNICAL FIELD

The invention relates to a circuit having a printed circuit board and to a vehicle having such a circuit.

BACKGROUND ART

In the field of automotive engineering, multilayer ceramic capacitors, hereinafter referred to as MLCCs, are used in particular for EMC (electromagnetic interference) filtering. However, these components can malfunction and, in particular, be subject to a short circuit, which is critical to safety in that resulting heat and/or flames can spread from the directly affected components to the vehicle.

As is shown in FIG. 10, an MLCC 10 forms an EMC filter 20, for example, which is housed in a control unit 26 together with a controller 22 and a power transmission unit 24. Additionally provided between this control unit 26 and the battery 28 of a vehicle is a fuse 30. Moreover, the control unit 26 is connected to the motor 32 of a vehicle, typically a brushless direct current motor.

According to FIG. 11, an MLCC 10 is configured in such a way that it comprises interlaced conductive layers 34, between which there is dielectric material 36.

As can be seen more clearly from FIG. 12, there is a particular risk that a leakage current 38 will occur, which does not trigger any protection measures but power consumption increases and heat is generated, which can result in the printed circuit board 12 also catching fire in the region below the MLCC 10. In FIG. 12a, 40 indicates a defect between two conductive layers 34, which results in the fault current 42 shown in FIG. 12b, and in heat generation. As is shown in FIG. 12c, this also heats the region of the printed circuit board 12 below the MLCC 10, such that a fault current 44 flows here too, which can result in the charring, delamination and combustion of the printed circuit board 12, and in major damage.

As can be seen from FIG. 14, a faulty MLCC can on the one hand result in a fault current opening the circuit and the current dropping from level 46 to, for example, 50 A, which is indicated by 48. The current flow is then interrupted and the voltage falls from level 50 to the load-free level 14V, which is indicated at 52.

According to FIG. 15, however, despite the initial reduction of the current from level 46 to 48, there may be an initial reduction of the voltage, indicated by 52, after the MLCC has broken down. The current then flows through the printed circuit board, however, and as a result the dangerous situations described above may occur.

According to US 2016 0120027 A, an MLCC is mounted on a printed circuit board via an intermediate layer. The intermediate layer may have an opening.

US 2015 0029674 A discloses an electronic component mounted on a printed circuit board over an opening, wherein the opening is filled with thermally conductive material.

SUMMARY

Against this background, the invention is based on the object of creating a circuit that is improved in terms of safety.

This object is achieved by the circuit as shown and described herein.

According thereto, the circuit comprises a printed circuit board and at least one MLCC and is characterized in that the printed circuit board has at least one opening in the region of the projection of the MLCC on the printed circuit board. This is not filled with any material and in the event of the MLCC malfunctioning it essentially prevents heat from accumulating between the MLCC and the printed circuit board, which could result in the ignition and charring of the printed circuit board material. Thus, flames cannot arise or at least cannot spread.

Damage to the arrangement of contacts of the MLCC on the printed circuit board, which are normally arranged in two parallel rows, can advantageously be prevented if at least one opening is elongated in a direction parallel to a row of contacts of the MLCC. In other words, the opening extends between and parallel to blocks or pads in which the contacts are arranged.

A particularly large opening, which therefore improves safety to a particularly high degree, can be created when at least one boundary of at least one opening coincides with the projection of the MLCC on the printed circuit board. At the same time, this only slightly affects the layout of the circuit, since the opening remains invisible when viewed from the direction of the MLCC.

Particularly good properties are expected if at least one opening has an area of at least 20% and/or at most 50% of the projection of the MLCC on the printed circuit board. Thus, the dimensions of the opening depend on the size of the MLCC. Particularly good results are expected in the case of MLCCs having the EIA code 1206 or 1209.

It is advantageous for the creation of the opening if it has at least one curved boundary. This can be created by, for example, the curvature of a drill or end mill used in this process.

At the same time, the creation can be kept simple if at least one opening has at least two parallel boundaries which are created, for example, by a translational motion of a drill or end mill.

The circuit according to the invention reveals its advantages particularly when the printed circuit board consists of FR4 material. This is particularly prone to charring, and therefore this undesirable effect can be counteracted particularly well by the opening according to the invention.

If a plurality of MLCCs is present, there are advantages for an efficient creation if at least one opening extends over the projection of two or more MLCCs.

The circuit according to the invention may be further characterized in that further components are mounted on the printed circuit board and/or in that the printed circuit board has strip conductors. In other words, the printed circuit board is not an intermediate element of some kind; rather, the printed circuit board populated with electronic components and/or strip conductors is itself advantageously modified in such a way that safety is improved.

This also applies to the embodiment in which the opening, in other words the surrounding of the opening on at least one side of the printed circuit board and/or the inner surface of the opening, which extends along the thickness of the printed circuit board, is not coated. As a result, an undesirable promotion of flame propagation can be prevented by making a current flow in this region less likely.

Particularly advantageously, the circuit according to the invention can be used at an operating voltage of 12V or 48V.

Finally, it should once again be stressed that the opening according to the invention is preferably free from any material.

Ultimately, the circuit according to the invention will preferably be used in an electric or hybrid vehicle since with such vehicles particular danger arises if there is a risk of flame propagation to the main battery. However, the circuit according to the invention is suitable for any vehicle in which the risk of flame propagation is to be avoided.

BRIEF DESCRIPTION OF THE DRAWINGS

Embodiments of the invention shown by way of example in the drawings will be described in more detail below. The drawings show the following:

FIG. 1 shows a perspective view of a section of the circuit according to the invention;

FIG. 2 shows a plan view of the section according to FIG. 1 without the MLCC;

FIG. 3 shows a plan view of an alternative embodiment in which several MLCCs are electrically connected to one another in parallel;

FIG. 4 shows a further plan view of the embodiment in FIG. 1, in which the position of an opening with respect to contact blocks can be seen;

DETAILED DESCRIPTION OF EMBODIMENTS OF THE INVENTION

As is shown in FIG. 1, an MLCC 10 is mounted on a printed circuit board 12 in such a way that the contacts thereof, which are not visible in FIG. 1 and which extend in parallel on the left and right outer edges, are contacted on blocks 14 of the printed circuit board 12. Parallel to and between the blocks 14, the end of an opening 16 can be seen in FIG. 1, which is easier to see in FIG. 2.

FIG. 2 reveals the substantially rectangular design of the blocks 14 and the elongated design of the opening 16 parallel thereto. In the case shown, the opening has two parallel side edges, which are substantially parallel to the longer edges of the blocks 14. The ends of the opening 16 are substantially formed by a semi-circle, such that the opening 16 can be efficiently created by means of a drill or end mill, the diameter of which substantially corresponds to the distance between the parallel edges.

Figure 17:
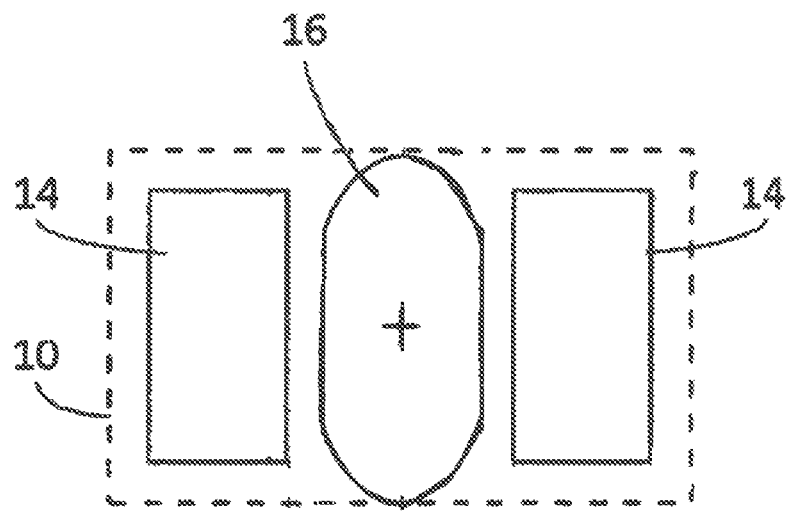
FIG. 17 shows a plan view of an alternative embodiment in which an end of an opening aligns with an edge a projection of an MLCC.
Figure 18:
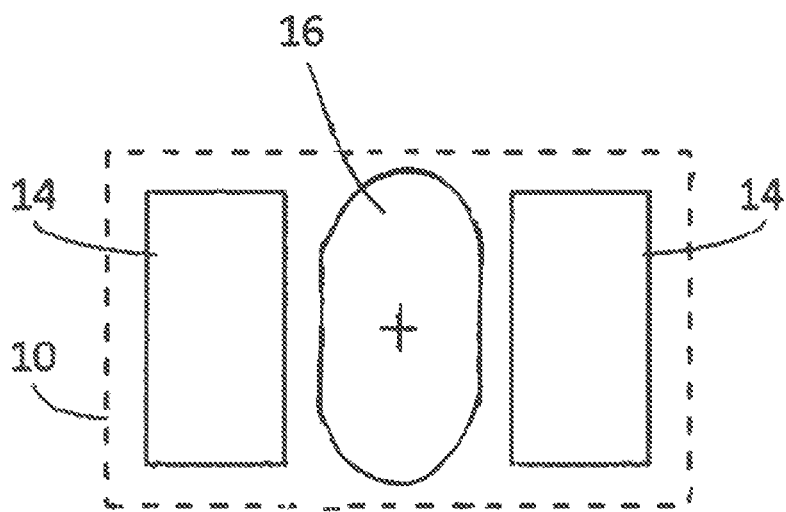
FIG. 18 shows a plan view of an alternative embodiment in which an opening is shorter than a projection of an MLCC.

This also applies to the embodiment in FIG. 3, in which the opening 16 extends under a plurality of MLCCs 10 which are indicated by dashed lines. The dashed lines essentially indicate the projection of the respective MLCC on the printed circuit board. Furthermore, the respective blocks 14 are shown, which correspond to those of FIG. 2, only the opening 16 is longer, corresponding to the plurality of MLCCs. According to FIG. 3, the opening protrudes slightly beyond the projection of the uppermost and lowermost MLCC according to FIG. 3, but the respective end may coincide with the edge of the projection as shown in FIG. 17, or the opening 16 may be shorter as shown in FIG. 18.

It should be noted by way of example that the longer sides of the blocks 14 can be between 1.5 and 2.8 mm long and can be spaced apart from one another by between 1.5 and 2 mm. The parallel edges of the opening 16 may in this case be spaced apart from one another by between 0.9 and 1 mm, and the opening 16 may have an overall length of 2.6 to 3.9 mm. This applies, for example, to an MLCC having a width (as measured from left to right in FIGS. 2 and 3) of 3.0 to 3.4 mm. According to FIG. 3, the blocks of adjacent MLCCs may be spaced apart by 0.8 mm, for example. In particular, the advantages according to the invention can be achieved particularly well with the dimensioning rule described.

FIG. 4 shows for the embodiment in FIG. 1 the two blocks 14, the projection of an MLCC 10 and the opening 16 between the blocks 14. This substantially corresponds to the situation in the surroundings of one of the three MLCCs shown by way of example in FIG. 3, and the exemplary dimensions set out above apply.

Figure 5:
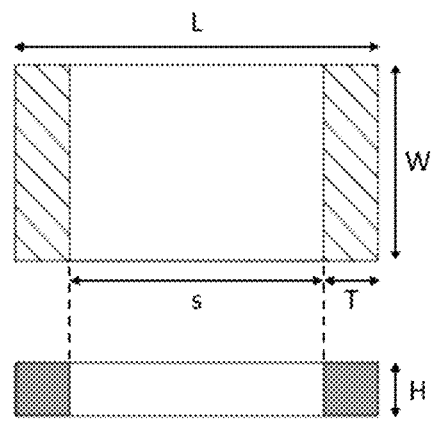
FIG. 5 shows two views and dimensions of a typical MLCC package.

FIG. 5 shows in the upper part thereof a plan view of a typical MLCC, the contacts of which are shown hatched. In the lower part, a side view is shown, not to scale, but it should be noted that depending on the design L can be between 3.0 and 3.4 mm, S between 1.5 and 2.3 mm, W between 1.4 and 2.7 mm, and T between 0.25 and 0.75 mm. In particular, the aforementioned exemplary dimensions of the blocks and opening apply to such measurements. The table below shows advantageous dimensions according to FIGS. 4 and 5 depending on the type of MLCC.

| EIA Inch Code | L [mm] | | S [mm] | | W [mm] | | T [mm] | | G [mm] | | X [mm] | | M [mm] | | N [mm] | |
|---|---|---|---|---|---|---|---|---|---|---|---|---|---|---|---|---|
| | min | max | min | max | min | max | min | max | min | max | min | max | min | max | min | max |
| 1206 | 3.0 | 3.4 | 1.5 | 2.3 | 1.4 | 1.8 | 0.25 | 0.75 | 1.5 | 2 | 1.5 | 1.9 | 0.9 | 1.1 | 2.6 | 3 |
| 1210 | 3.0 | 3.4 | 1.5 | 2.3 | 2.3 | 2.7 | 0.25 | 0.75 | 1.5 | 2 | 2.4 | 2.8 | 0.9 | 1.1 | 3.5 | 3.9 |

Figure 6:
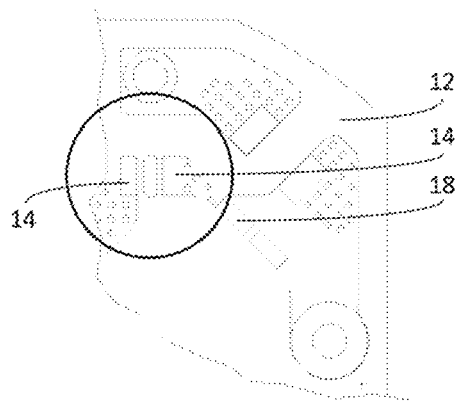
FIG. 6 shows the embodiment in FIG. 1 with its surroundings on a printed circuit board.
Figure 7:
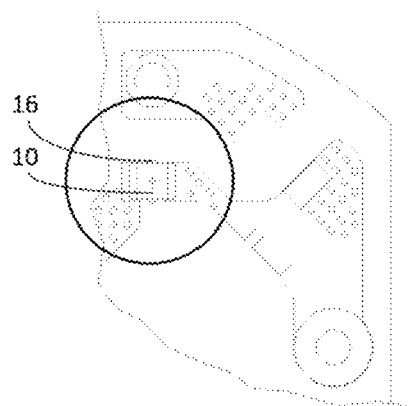
FIG. 7 shows the section in FIG. 6 with an MLCC.

In FIG. 6 it can be seen on the basis of the embodiment in FIG. 1 that on the printed circuit board 12 strip conductors 18 follow the blocks 14, which strip conductors may be connected to further electronic components. FIG. 7 shows the section in FIG. 6 in this case with one MLCC 10. This substantially corresponds to the situation shown in FIG. 1, wherein according to FIG. 7 at both ends the opening 16 protrudes slightly beyond the projection of the MLCC 10.

Figure 8:
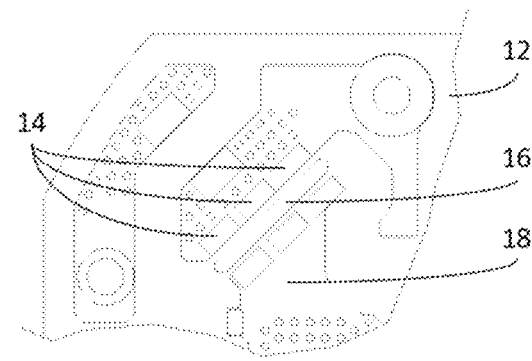
FIG. 8 shows the implementation of the embodiment in FIG. 3 with three places for MLCCs and the surroundings thereof on a printed circuit board.

FIG. 8 shows a similar section for the embodiment in FIG. 3, wherein in this case three pairs of blocks 14 and a correspondingly long opening 16 are provided.

Figure 9:
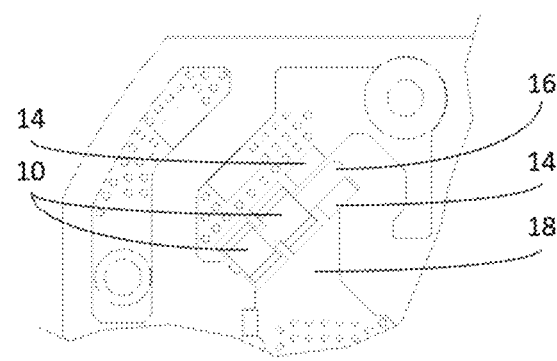
FIG. 9 shows the section in FIG. 8 with two MLCCs.
Figure 10:
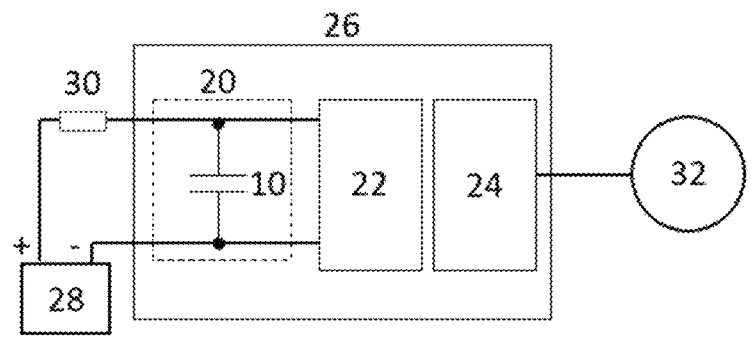
FIG. 10 shows a block diagram with an MLCC, which is provided in a typical arrangement with an EMC filter in power supply lines.
Figure 11:
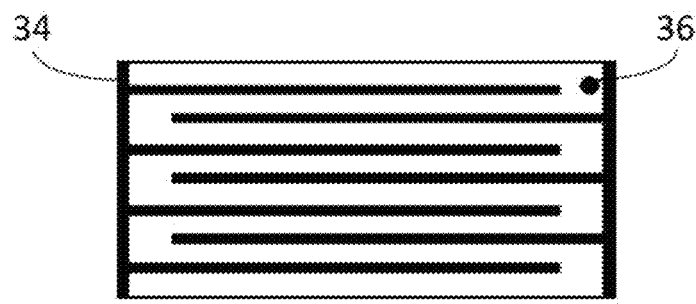
FIG. 11 schematically shows the structure of the internal layers of an MLCC.

As can be seen in FIG. 9, such an embodiment is suitable for three MLCCs, of which only two are shown in FIG. 9. In the surroundings thereof, strip conductors 18 can again be seen.

Figures 12, 13:
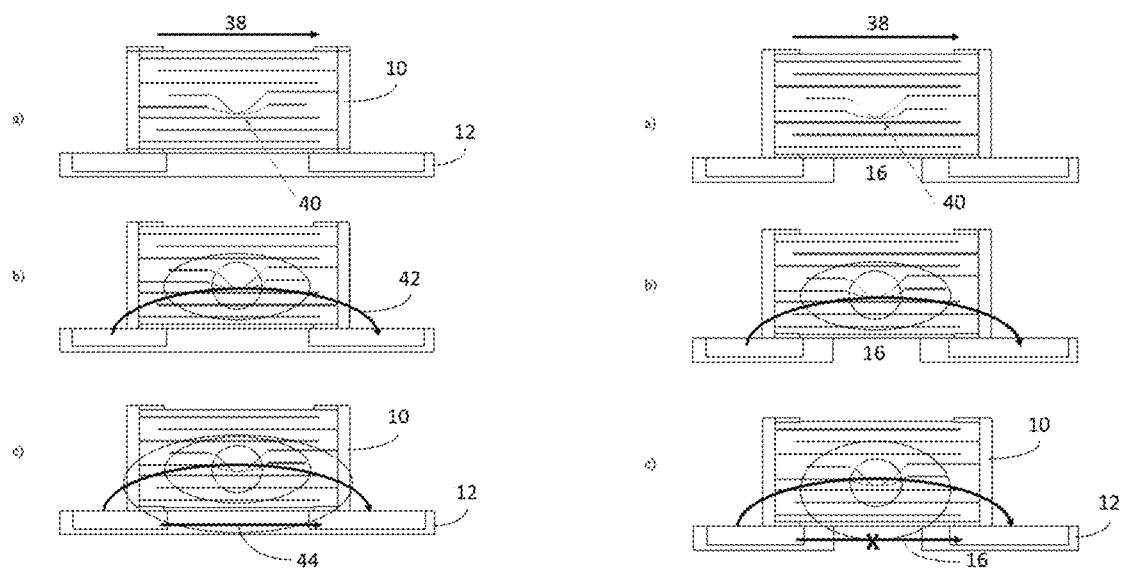
FIG. 12a to c show the development of a fault in the surroundings of an MLCC.
FIG. 13a to c show the prevention of such a fault as according to the invention.
Figure 14:
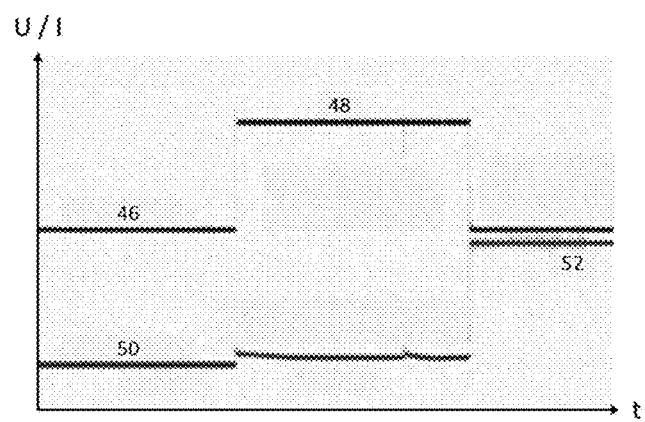
FIGS. 14 and 15 show a current and voltage diagram in the event of a fault in a conventionally used MLCC.

According to FIGS. 13A and B, the development in the event of a leakage current in the case of the solution according to the invention is initially identical to that described with reference to FIG. 12, but on account of the opening 16 in the printed circuit board 12 in the region below the MLCC 10, charring of the printed circuit board 12 and the combustion thereof can be prevented.

Figure 15:
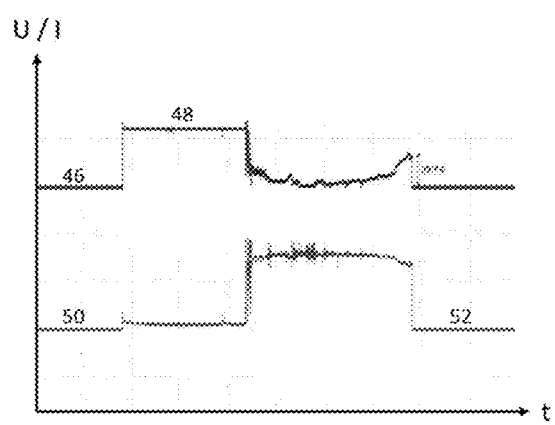
Figure 16:
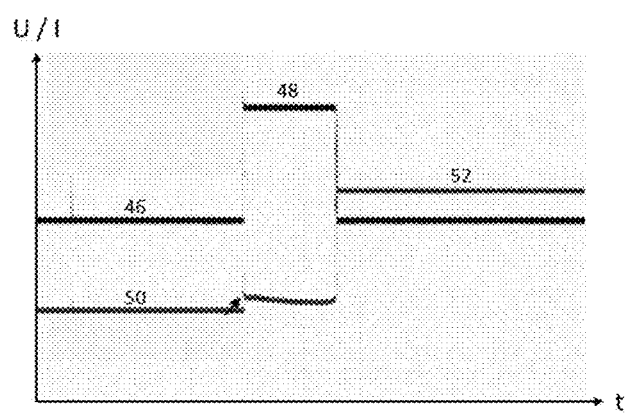
FIG. 16 shows a current and voltage diagram in the event of a fault in an MLCC built in according to the invention.

As can be seen from FIG. 16, in particular when compared with FIG. 15, there is no current flow through the printed circuit board, and the current and voltage fall to safe levels, such that only the MLCC is damaged, but no charring, delamination or flame propagation takes place.

What is claimed is:

1. A circuit having a printed circuit board and at least one multilayer ceramic capacitor (MLCC), wherein the printed circuit board has at least one opening penetrating the printed circuit board in a region of a projection of the MLCC on the printed circuit board, and wherein at least one boundary of the at least one opening aligns with an edge of the projection of the MLCC on the printed circuit board.

2. The circuit according to claim 1, wherein the at least one opening is elongated in a direction parallel to a row of contacts of the MLCC.

3. The circuit according to claim 1, wherein the at least one opening has an area of at least 20% and/or at most 50% of the projection of the MLCC on the printed circuit board.

4. The circuit according to claim 1, wherein the at least one opening has at least one curved boundary.

5. The circuit according to claim 1, wherein the at least one opening has at least two parallel boundaries.

6. The circuit according to claim 1, wherein the printed circuit board consists of FR4 material.

7. The circuit according to claim 1, wherein there are a plurality of MLCCs and the at least one opening extends over the projection of two or more MLCCs.

8. The circuit according to claim 1, wherein further components are mounted on the printed circuit board.

9. The circuit according to claim 1, wherein the printed circuit board has strip conductors.

10. The circuit according to claim 1, wherein the at least one opening is not coated.

11. The circuit according to claim 1, wherein the circuit is designed for a 12V and/or 48V operating voltage.

12. The circuit according to claim 1, wherein the at least one opening is free from any material.

13. A vehicle having at least one circuit according to claim 1.

* * * * *